US 6,624,065 B2

(12) United States Patent
Jang et al.

(10) Patent No.: US 6,624,065 B2
(45) Date of Patent: Sep. 23, 2003

(54) METHOD OF FABRICATING A SEMICONDUCTOR DEVICE USING A DAMASCENE METAL GATE

(75) Inventors: Se Aug Jang, Kyoungki-do (KR); Woo Seock Cheong, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 21 days.

(21) Appl. No.: 09/976,410

(22) Filed: Oct. 12, 2001

(65) Prior Publication Data

US 2002/0045332 A1 Apr. 18, 2002

(30) Foreign Application Priority Data

Oct. 13, 2000 (KR) ........................................ 2000-60416

(51) Int. Cl.$^7$ .......................................... H01L 21/4163
(52) U.S. Cl. ...................... 438/633; 438/637; 438/639; 438/645; 438/648; 438/688; 438/722; 438/723; 438/724; 438/259; 257/330
(58) Field of Search ................................ 438/183, 585, 438/649, 651, 633, 740, 279, 299, 303, 595, 637, 631, 639, 645, 648, 685, 684, 688, 722, 723, 724, 259; 257/330

(56) References Cited

U.S. PATENT DOCUMENTS

| 6,194,301 | B1 | | 2/2001 | Radens et al. | |
| 6,225,170 | B1 | | 5/2001 | Ibok et al. | |
| 6,258,679 | B1 | * | 7/2001 | Burns | 438/303 |
| 6,307,226 | B1 | * | 10/2001 | Dennison | 257/296 |

* cited by examiner

Primary Examiner—Matthew Smith
Assistant Examiner—B V Keshavan
(74) Attorney, Agent, or Firm—Ladas & Parry

(57) ABSTRACT

A method of fabricating a semiconductor device using a damascene metal gate including the steps of forming a damascene gate oxide layer and a damascene gate electrode on a semiconductor substrate, forming a trench at an upper part of the damascene gate electrode by selectively etching a portion of the damascene gate electrode to a predetermined thickness, forming an insulating layer in the trench on the damascene gate electrode, forming an insulating interlayer on an upper surface of the entire structure, and forming a contact hole exposing a portion of the semiconductor substrate by selectively etching the insulating interlayer.

25 Claims, 7 Drawing Sheets

US 6,624,065 B2

METHOD OF FABRICATING A SEMICONDUCTOR DEVICE USING A DAMASCENE METAL GATE

BACKGROUND OF THE INVENTION

1. Field of the Invention

The present invention relates generally to a method of fabricating a semiconductor device, and more particularly, to a method of fabricating a semiconductor device using a damascene metal gate enabling the prevention of electric short circuits.

2. Description of the Related Art

Polysilicon or polycide gate electrodes are used for sub-0.1 µm devices in general. Yet, use of a polysilicon gate results in a number of unintended consequences, such as increasing effective thickness of gate insulating layers due to gate depletion effect, threshold voltage variance due to boron penetration from a p+ or n+ doped polysilicon gate into a substrate, dopant distribution fluctuation and the like. Moreover, an inability to maintain low resistance has been noted in devices having submicron CD having gates using polysilicon.

Therefore, continued decrease in the size of gate electrodes below submicron size requires developments for new materials and structures as substitutes for the conventional gates using polysilicon.

In order to meet such requirements, many efforts have been made to develop metal gate electrodes. Certain disadvantages and problems, such as boron penetration and gate depletion, do not arise in a metal gate using no dopant. Moreover, the metal gate has a work function value that corresponds to a mid-band gap of silicon, thereby allowing application to a single gate enabling the formation of a symmetric threshold voltage in NMOS and PMOS areas. In this case, W, WN, Ti, TiN, Mo, Ta, TaN and the like are metals for which work function values correspond to the mid-gap of silicon.

A transistor using a metal gate electrode, when fabricated by a conventional method using a polysilicon gate electrode, gives rise to fatal defects, such as a difficulty in patterning a metal gate electrode, generation of plasma damage caused by plasma produced by ion implantation for forming the source/drain regions, and thermal damage due to thermal treatment after ion implantation.

A new metal gate damascene process for forming a metal gate electrode is described to overcome these disadvantages resulting from use of metal gates in a semiconductor device.

The metal gate damascene process for forming a metal gate electrode includes the steps of forming a polysilicon gate as a dummy gate, forming source/drain regions so as to complete a transistor, removing the polysilicon gate as the dummy gate, and forming a metal gate using a damascene process.

A method of fabricating a semiconductor device using a damascene metal gate according to a related art is explained by referring to FIGS. 1 to 7, as follows.

FIGS. 1 to 7 illustrate cross-sectional views of a semiconductor device showing the fabrication steps using a method of forming a damascene metal gate according to a related art.

Referring to FIG. 1, a silicon oxide layer and a polysilicon layer are formed on a silicon substrate 11 by a conventional method of forming a polysilicon gate electrode. A dummy gate insulating layer 12 and a dummy gate electrode 13 are then formed by patterning the polysilicon and silicon oxide layers, respectively.

Subsequently, spacers 14 are formed at both sidewalls of the dummy gate insulating layer 12 and the dummy gate electrode 13.

Source/drain regions (not shown) are formed in the semiconductor substrate 11 below both lateral sides of the spacers 14 by ion implantation.

Referring to FIG. 2 and FIG. 3, an insulating interlayer 15 is formed on an entire surface of the substrate 11. The dummy gate electrode 13 is then exposed by polishing the insulating interlayer 15 by chemical mechanical polishing (CMP).

Referring to FIG. 4, a trench 16 is formed by selectively etching the exposed dummy gate electrode 13 and the exposed dummy gate insulating layer 12 underneath so as to expose the substrate 11 where the dummy gate electrode 13 and dummy gate insulating layer 12 have been removed.

Referring to FIG. 5, an insulating layer 17 and a metal layer 18 are formed on the insulating interlayer 15 including on the trench 16.

Subsequently, the insulating interlayer 15 is exposed by selectively removing the insulating layer 17 and metal layer 18 by polishing or other appropriate method. A damascene gate insulating layer 19 and a damascene metal gate electrode 20 are formed, the damascene gate insulating layer 19 being formed of a general gate insulator such as silicon oxide, $Ta_2O_5$, $Al_2O_3$ or the like, and the damascene metal gate electrode 20 being formed of tungsten. Alternatively, the damascene metal gate electrode 20 may be formed of a material taken form a group comprising one or more of the following metals or alloys: WN, Ti, TiN, Ma, Ta and the like.

Referring to FIG. 7, an insulating interlayer 21 is formed on an entire surface of the substrate 11. Contact holes 23, such as a bitline contact hole or a storage electrode contact hole, are then formed by etching the insulating interlayer 21 using a photoresist layer 22 as a mask so as to expose the source/drain regions (not shown). Metal wires or bitline/storage electrode wire for a memory device, not shown in the drawing, provide electrical connections to the source/drain regions (not shown) through the contact holes 23.

The above-explained conventional method of fabricating a semiconductor device using the damascene metal gate electrode has certain disadvantages. In the related art, the damascene metal gate electrode is formed after the formation of the source/drain regions, thereby inhibiting plasma damage caused by the ion implantation for source/drain and the thermal damage caused by the succeeding thermal treatment, both of which are encountered in the conventional method of forming a damascene metal gate electrode.

Unfortunately, non-uniformity in the contact exposure process occurs in the conventional method of fabricating a semiconductor device, especially when the device is more highly integrated, whereby the damascene gate electrode is exposed as shown in FIG. 7.

Therefore, as shown at 'A' in FIG. 7, the damascene gate electrode is exposed due to non-uniformity in the contact exposure process, thereby resulting in an undesirable short-circuit with a bitline or a storage electrode line formed in a succeeding process.

SUMMARY OF THE INVENTION

Accordingly, the present invention is directed to a method of fabricating a semiconductor device using a damascene metal gate that substantially avoids one or more of the problems resulting from the above-described limitations and disadvantages of the related art.

The object of the present invention is to provide a method of fabricating a semiconductor device using a damascene metal gate so as to prevent a short-circuit caused by non-uniformity in the contact exposure process.

Additional features and advantages of the invention will be set forth in the detailed description of preferred embodiments, which follows, and in part will be apparent from that description or study of the drawing figures, or may be learned by practice of the invention. The objectives and other advantages of the invention will be realized and attained by the structure particularly pointed out in the written description and claims hereof, as well as in the appended drawings.

To achieve these and other advantages, and in accordance with the purposes of the present invention as embodied and broadly described herein, a method of fabricating a semiconductor device using a damascene metal gate according to the present invention includes the steps of forming a damascene gate oxide layer and a damascene gate electrode on a semiconductor substrate, forming a trench at an upper part of the damascene gate electrode by selectively etching a portion of the damascene gate electrode to a predetermined thickness, forming an insulating layer in the trench at the upper part of the damascene gate electrode, forming an insulating interlayer on an upper surface of the entire structure, and forming a contact hole exposing a portion of the semiconductor substrate by selectively etching the insulating interlayer.

In another aspect of the present invention, a method of fabricating a semiconductor device using a damascene metal gate includes the steps of forming a damascene gate oxide layer and a damascene gate electrode on a semiconductor substrate, forming a trench at an upper part of the damascene gate electrode by selectively etching a portion of the damascene gate electrode to a predetermined thickness, forming an aluminum layer only in the trench at the upper part of the damascene gate electrode, turning the aluminum layer into an aluminum insulating layer, forming an insulating interlayer on an upper surface of the entire structure, and forming a contact hole exposing a portion of the semiconductor substrate by selectively etching the insulating interlayer.

In a further aspect of the present invention, a method of fabricating a semiconductor device using a damascene metal gate includes the steps of forming a damascene gate oxide layer and a damascene gate electrode on a semiconductor substrate, forming a trench at an upper part of the damascene gate electrode by selectively etching a portion of the damascene gate electrode to a predetermined thickness, forming an undoped silicon layer in the trench at the upper part of the damascene gate electrode, turning the undoped silicon layer into an insulating layer, forming an insulating interlayer on an upper surface of the entire structure, and forming a contact hole exposing a portion of the semiconductor substrate by selectively etching the insulating interlayer.

It is to be understood that both the foregoing general description and the following detailed description are exemplary and explanatory only and are intended to provide further explanation of the invention, as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1:
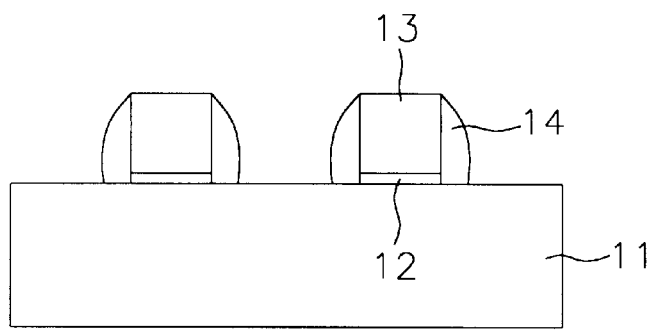
FIGS. 1 to 7 illustrate cross-sectional views of the steps of fabricating a semiconductor device using a conventional method of forming a damascene metal gate.
Figure 2:
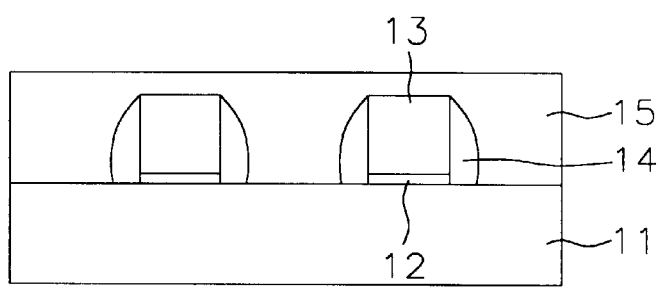
Figure 3:
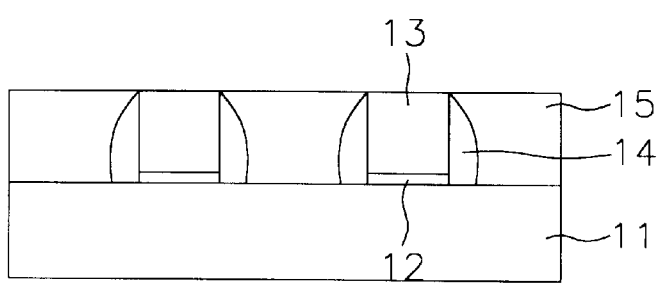
Figure 4:
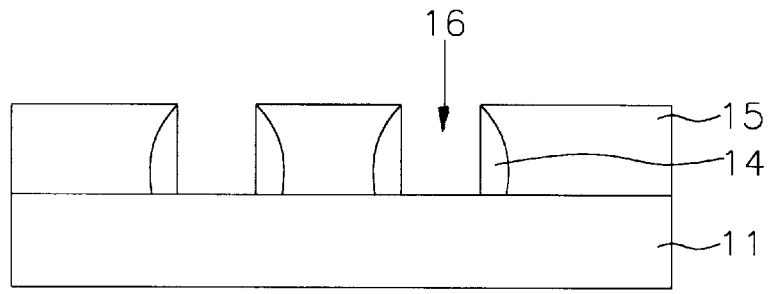
Figure 5:
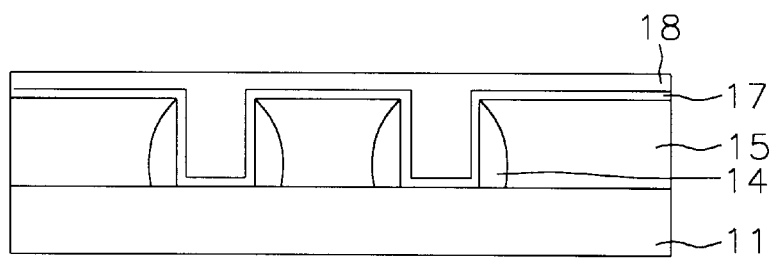
Figure 6:
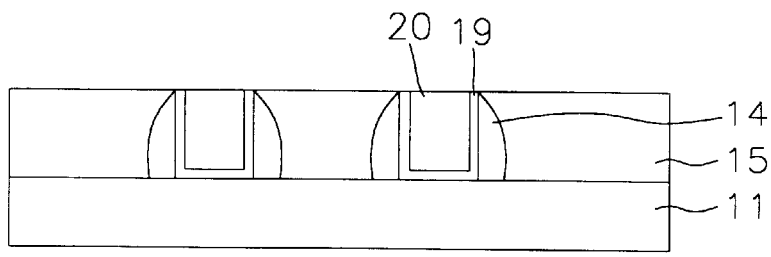
Figure 7:
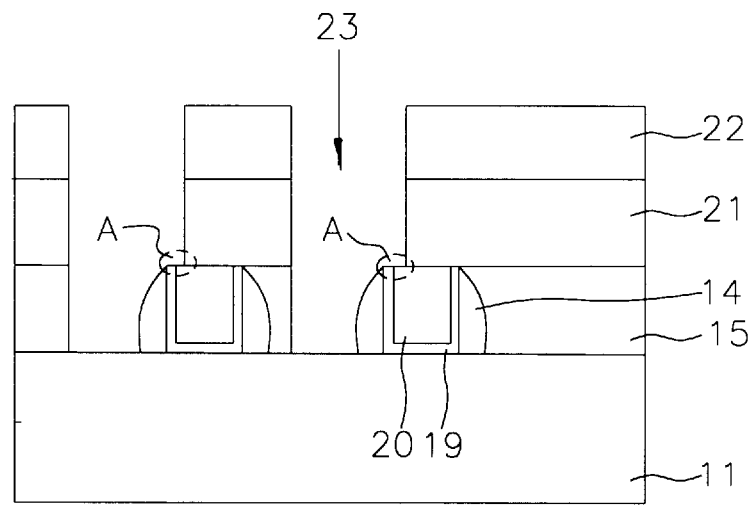

Reference will now be made in detail to the preferred embodiments of the present invention, examples of which are illustrated in the accompanying drawing FIGS. 8 to 13 and FIGS. 14 to 19. Where possible, the same reference numerals will be used to illustrate like elements throughout the specification.

FIGS. 8 to 13 illustrate cross-sectional views of the steps of fabricating a semiconductor device using a method of forming a damascene metal gate according to an embodiment of the present invention.

Figure 8:
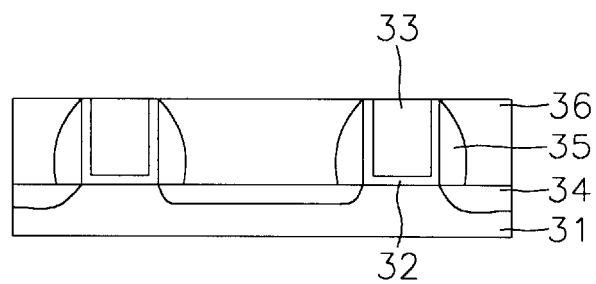
FIGS. 8 to 13 illustrate cross-sectional views of the steps of fabricating a semiconductor device using a method of forming a damascene metal gate according to an embodiment of the present invention.

Referring to FIG. 8, a damascene gate insulating layer 32 and a gate electrode 33 are formed on a silicon substrate 31 by a conventional method of forming a damascene metal gate. In this case, the gate electrode 33 is formed of an electrically-conductive material, such a s W, WN, Ti, TiN, Mo, Ta, TaN or the like. The damascene gate electrode 33 preferably is formed to a thickness of between 2000 to 2500Å thick.

Subsequently, an insulating interlayer 36 is formed on the entire surface of the semiconductor substrate 31. The damascene gate electrode 33 is then exposed by carrying out CMP on the insulating interlayer 36 until the surface of the damascene gate electrode 33 is exposed by The damascene metal gate transistor includes source/drain regions 34 in the semiconductor substrate 31 below both lateral sides of the damascene gate electrode 33 and spacers 35 formed at both sidewalls of the damascene gate electrode 33. The source/drain regions 34 are preferably formed by general ion implantation.

Figure 9:
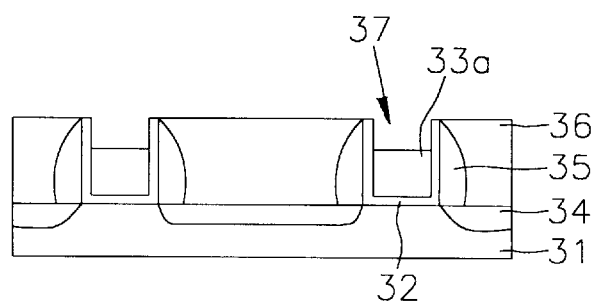

Referring to FIG. 9, the exposed damascene gate electrode 33 is etched in part by known either a dry etch or wet etch process so as to form a trench 37 having a thickness of between 500 to 1000Å at an upper part of the damascene gate electrode 33a. In this case, the etched portion of the damascene gate electrode 33 is removed by a recessed-etch process.

Figure 10:
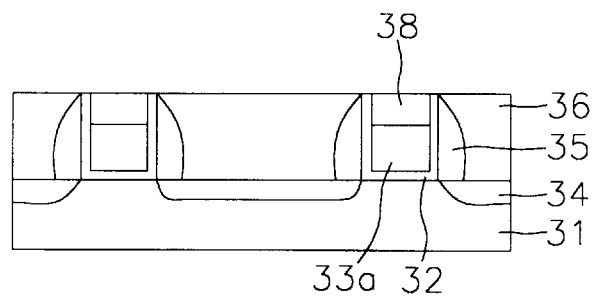

Referring now to FIG. 10, a conductive layer 38, such as an aluminum layer 38, is selectively grown on the damascene gate electrode 33a inside the trench 37 only, by MOCVD (metal organic chemical vapor deposition) The selective growth of the aluminum layer 38 by MOCVD may be achieved by charge transfer effect. Thus, aluminum growth on the insulating interlayer 36, which is a non-conductor, is inhibited. On the contrary, the aluminum layer 38 selectively grows only on the damascene gate electrode 33a, which is a conductor.

The selective growth of the aluminum layer 38 is explained in detail as follows. First, a cleaning process is carried out before growing so as to make the Al grow selectively. The cleaning process is carried out on the exposed damascene gate electrode 33a using H$_2$SO$_4$ and H$_2$O$_2$, thereby enabling the removal of organic impurities.

Preferably, the first cleaning step is processed in a solution having a ratio 30~50:1 of H$_2$SO$_4$ to H$_2$O$_2$ for between 5 to 20 minutes at a process temperature of between 60 to 100° C.

A second cleaning step is then processed in a 50 to 500 times diluted HF solution for about 20 to 200 seconds. Subsequently, an aluminum layer is grown by low pressure MOCVD using DMAH [dimethylaluminum, (CH$_3$)$_2$AlH] and H$_2$ as process gas after the cleaning steps at a process temperature of between 250 to 450° C., and at a pressure of between 1 to 150 Torr, and fluid flows of DMAH and H$_2$ at between 0.02~1.00 slm and between 1~50 slm, respectively. Alternatively, the selective aluminum growth may be carried out without H$_2$ process gas.

Figure 11:
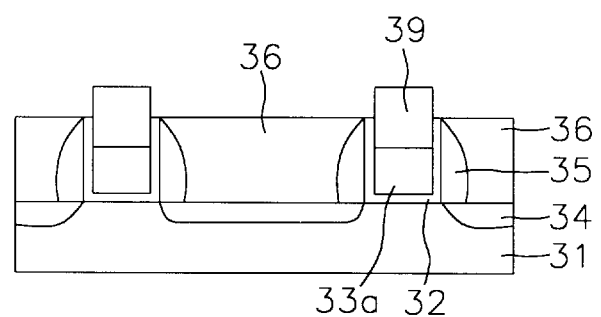

Referring to FIG. 11, following the growth of the aluminum layer 38, an insulating layer 39 is formed in the trench 37 over the upper part of the damascene gate electrode 33a. For instance, the insulating layer 39 is formed by oxidizing the aluminum layer 38 in the trench 37 into an aluminum oxide layer (Al$_2$O$_3$).

Alternatively, the aluminum layer 38 may be oxidized by one of various oxidation methods such as oxidation in an ambient oxygen atmosphere, N$_2$O plasma treatment oxidation, UV-O$_3$ treatment oxidation or the like.

Optionally, the insulating layer 39 may be formed in the trench 37 in a different manner, for example, a nitridation step may carried out on the aluminum layer 38 to form an aluminum nitride (AlN) layer. Thus, the damascene gate electrode 33a is covered with the insulating layer 39 by forming the aluminum nitride or aluminum oxide layer on the upper part of the damascene gate electrode 33a.

Figure 12:
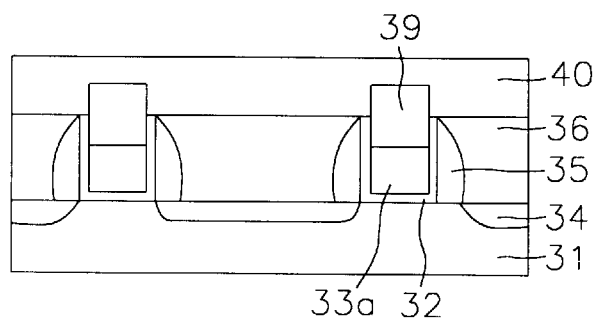

Referring to FIG. 12, an insulating interlayer 40 is formed on an entire surface of the substrate, including over the damascene gate electrode.

Figure 13:
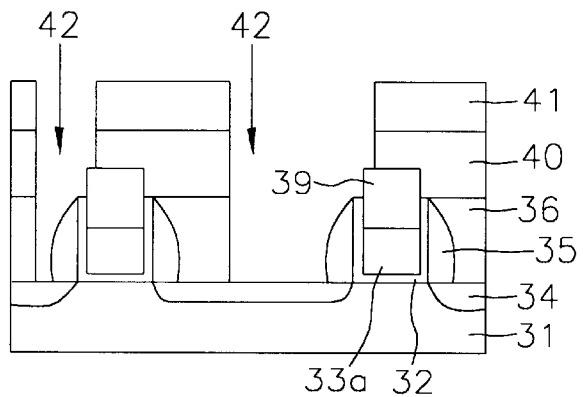

Referring to FIG. 13, contact holes 42 are formed by selectively etching the insulating interlayer 40 using a photoresist layer 41 as a mask so as to expose the source/drain regions 34. In this case, the contact holes 42 are used to provide a bitline contact and/or a storage electrode contact when the method of fabricating a semiconductor device according to the present invention is applied to a memory device such as a DRAM. Although non-uniformity is generated when the contact holes 42 are formed, the damascene gate electrode 33a is not exposed since, the upper part of the damascene gate electrode 33a is covered with the insulating layer 39.

Therefore, the bitline or storage electrode line, not shown in the drawing, is electrically connected to the source region through the contact hole 42 without creating a short-circuit caused by non-uniformity even if the bitline or storage electrode line is formed by a succeeding process.

Another embodiment of the present invention is described by referring to FIGS. 14 to 19, as follows. FIGS. 14 to 19 illustrate cross-sectional views of the steps of J fabricating a semiconductor device using a method of forming a damascene metal gate according to another embodiment of the present invention. A method fabricating a semiconductor device using a damascene metal gate according to this embodiment of the present invention is similar to that of the semiconductor device fabrication method according to the foregoing embodiment of the present invention. Yet, as shown in FIG. 16 and FIG. 18, a silicon oxide layer or a silicon nitride layer is formed as an insulating layer 61 in a trench at an upper part of a damascene gate electrode 53a and the silicon layer 59, instead of forming an aluminum layer. The insulating layer 61 is formed by selectively growing an undoped silicon layer 59 (FIG. 17) in the trench and then carrying out oxidation or nitridation on the undoped silicon layer 59 (FIG. 18).

Figure 14:
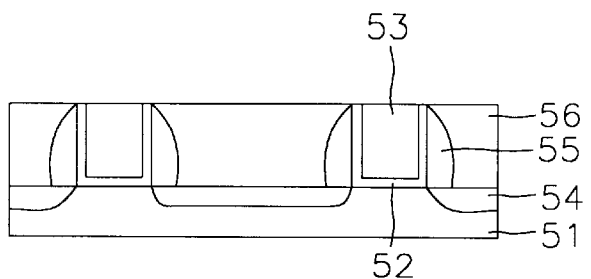
FIGS. 14 to 19 illustrate cross-sectional views of the steps of fabricating a semiconductor device using a method of forming a damascene metal gate according to another embodiment of the present invention.
Figure 15:
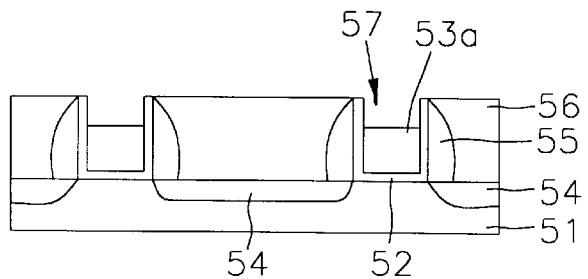
Figure 16:
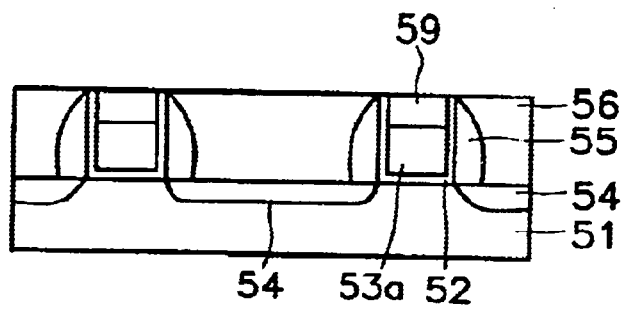

Referring to FIG. 14 and FIG. 15, a gate oxide layer 52 and a damascene gate electrode 53 are formed, for example, by conventional methods, and then a trench 57 is formed by etching the damascene gate electrode 53, in part as done in FIG. 8 and FIG. 9.

Referring to FIG. 16, a silicon layer 59 is selectively grown in the trench 57 at an upper part of the damascene gate electrode 53a, which is achieved by the following steps.

First, a first cleaning step is carried out before the growing so as to make silicon grow selectively. In this case, the first cleaning step is carried out on the exposed damascene gate electrode 53a using H$_2$SO$_4$ and H$_2$O$_2$ so as to remove organic impurities. The first cleaning step preferably is processed in a mixture solution having a ratio of between 30 to 50:1 between H$_2$SO$_4$ and H$_2$O$_2$ for a period of between 5 to 20 minutes at a process temperature between 60 to 100° C.

A second cleaning step is then processed in a HF solution that has been diluted 50~500 times for between 20 to 200 seconds.

Subsequently, a silicon layer is grown by CVD. In this case, there are two alternative methods for the selective silicon growth in accordance with two CVD equipments.

In the first selective silicon growth method using LPCVD (low pressure chemical vapor deposition), micro-deposits, which are electrically charged, are produced by chemi-ionization effect in a vapor phase. Growth of the micro-deposits is triggered only by the conductor receiving an attractive force. Thus, growth of the undoped silicon layer 59 is inhibited at the insulating interlayer 56 but is carried out on the damascene metal gate electrode 53a only.

The preferred growth conditions of the silicon layer 59 by LPCVD are the use of DCS (diclorosilane, SiCl$_2$H$_2$) HCl, and H$_2$ as the process gas, the respective flows are 0.1–2 slm DCS, 0.1~3 slm HCl, and H$_2$ 10~150 slm , the process temperature is between 750 and 850° C., and the pressure is between 10 and 200 Torr.

Alternatively, an in-situ cleaning process is carried out during the selective growth of the silicon layer 59. In this case, the in-situ cleaning process is carried out for between 1 to 5 minutes at a temperature of between 850 to 950° C. in an ambient atmosphere of hydrogen. Instead, the in-situ cleaning process may be carried out by a RTP (rapid thermal process) in which the temperature is abruptly increased up to 950° C. and then dropped to the silicon growth temperature.

Also as an alternative method, SiH$_4$ may be used as the process gas for the selective growth of the silicon layer 59 instead of DCS. In this case, the temperature and pressure are the same as used for the DCS and process gas flows are 0.1 to 2 slm SiH$_4$, 0.2~ to 4 slm HCl, and 10~ to 150 slm H$_2$.

In the second selective silicon growth method, in which UHV-CVD is used, a width of pure selective growth depends on an initial nucleation speed between the conductor and the non-conductor. In this case, SiH$_4$ or Si$_2$H$_6$/Cl is used as a process gas, where the flow of SiH$_4$ or Si$_2$H$_6$ is between 1 to 20 sccm and a flow of Cl is between 0.5 to 5 sccm at a pressure between 1 to 10 mm Torr and a temperature between 600 to 800° C. Optionally, 5 to 50 sccm H$_2$ may be added thereto, if necessary. Moreover, before a silicon layer is grown by UHV-CVD, an initial pressure is set as 7 to 10 mm Torr by pumping, and preferably vacuum cleaning is carried out for between 0.5 to 5 minutes.

Figure 17:
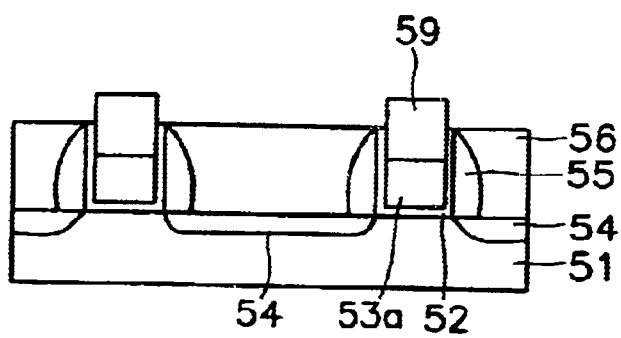
Figure 18:
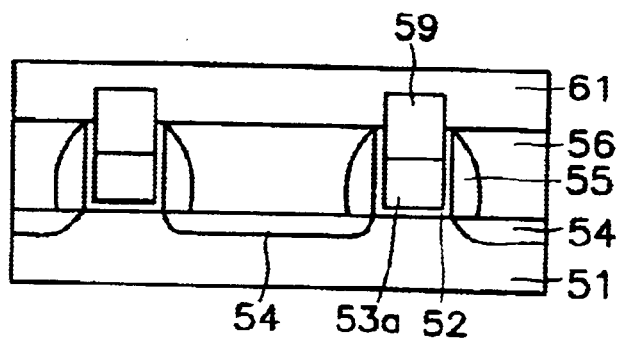

Referring now to FIGS. 17 and 18, an insulating layer 61, such as an oxide layer or a nitride layer, is formed on the upper part of the damascene metal gate electrode 53a and the silicon layer 59 by carrying out oxidation or nitridation on the silicon layer 59, which may be the same as insulating layer 40 used in FIG. 11. Therefore, the damascene gate electrode 53a is covered with the insulating layer 61 and the silicon layer 59 so as not to be exposed, as shown in FIG. 18.

Figure 19:
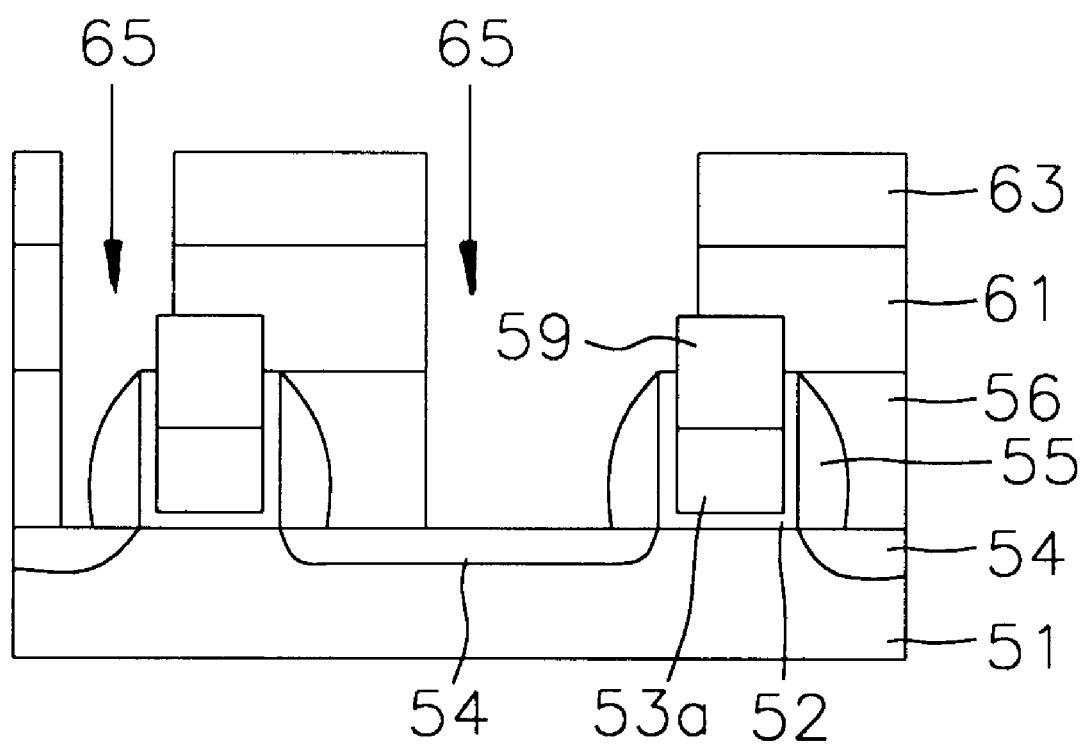

Referring to FIG. 19, an insulating interlayer 63 is formed on an entire surface of the substrate including over the insulating layer 61 and the silicon layer 59 and the damascene gate electrode 53a. Referring to FIG. 19, contact holes 65 are then formed by selectively etching the insulating interlayer 63 and using it as a photoresist layer 63 to provide a mask and thus, to expose the source/drain regions 54. Although non-uniformity is generated when the contact holes 65 are formed, the damascene gate electrode 53a is not exposed since the upper part of the damascene gate electrode 53a is covered with the insulating layer 61 and the silicon layer 59.

Therefore, the bitline or storage electrode line, (not shown in the drawing), is electrically connected to the source region through the contact hole 65 without bringing about a short-circuit caused by non-uniformity even if the bitline or storage electrode line is formed by a succeeding process.

As mentioned in the above description, a method of fabricating a semiconductor device using a damascene metal gate has the following advantages.

The present invention enables the prevention of an electric short between the damascene metal gate and a wire formed by a succeeding process, such as a bitline or storage electrode node, by forming an insulating layer on an upper part of a damascene metal gate even if non-uniformity is generated during forming of a contact hole.

Therefore, the above-described methods of fabricating a semiconductor device using a damascene metal gate according to the present invention provide a semiconductor device having excellent characteristics.

The foregoing embodiments are merely exemplary and are not to be construed as limiting the present invention. The present teachings can be readily applied to other types of apparatus. The description of the present invention is intended to be illustrative, and not to limit the scope of the claims. Many alternatives, modifications, and variations will be apparent to those skilled in the art.

What is claimed is:

1. A method of fabricating a semiconductor device using a damascene metal gate comprising the steps of:
    forming a damascene gate oxide layer and a damascene gate electrode on a semiconductor substrate;
    selectively etching a portion of the damascene gate electrode to a predetermined thickness to form a trench at an upper portion of the damascene gate electrode;
    forming an insulating layer in the trench;
    forming an insulating interlayer on an upper surface of the entire structure; and
    selectively etching the insulating interlayer to form a contact hole exposing a portion of the semiconductor substrate.

2. The method of claim 1, wherein the damascene gate electrode further comprises a metal selected from the group consisting of W, WN, Ti, TiN, Mo, Ta, and TaN.

3. The method of claim 1, wherein the damascene gate electrode has a thickness of between 2000 to 2500 Å.

4. The method of claim 3, wherein the trench is formed by removing a thickness of 500 to 1000 Å of the damascene gate electrode by recessed-etch using a wet etch method or a dry etch method.

5. The method of claim 1, wherein the insulating layer is formed of an aluminum insulating layer or an undoped polysilicon layer.

6. The method of claim 5, wherein the aluminum insulating layer is formed by forming a selective aluminum layer in the trench after the trench is formed and carrying out oxidation or nitridation on the selective aluminum layer.

7. A method of fabricating a semiconductor device using a damascene metal gate including the steps of:
    forming a damascene gate oxide layer and a damascene gate electrode on a semiconductor substrate;
    selectively etching a portion of the damascene gate electrode to a predetermined thickness to form a trench at an upper portion of the damascene gate electrode;
    forming an aluminum layer only in the trench;
    turning the aluminum layer into an aluminum insulating layer;
    forming an insulating interlayer on an upper surface of the entire structure; and
    selectively etching the insulating interlayer to form a contact hole exposing a portion of the semiconductor substrate.

8. The method of claim 7, wherein the damascene gate electrode further comprises a metal selected from the group consisting of W, WN, Ti, TiN, Mo, Ta, and TaN.

9. The method of claim 7, wherein the damascene gate electrode is formed to a thickness between 2000 to 2500Å.

10. The method of claim 9, wherein the trench is formed by removing a thickness of 500 to 1000 Å of the damascene gate electrode by recessed-etch using a wet etch method or a dry etch method.

11. The method of claim 7, wherein the aluminum insulating layer is an aluminum oxide layer or an aluminum nitride layer.

12. The method of claim 11, wherein the aluminum oxide layer is formed by one of oxidation in an ambient oxygen atmosphere ambience, $N_2O$ plasma treatment oxidation, or $UV-O_3$ treatment oxidation.

13. The method of claim 7, wherein the selective aluminum layer is formed using DMAH [dimethylaluminum, $(CH_3)_2AlH$] and $H_2$ as process gas under the conditions of process temperature between 250 to 450° C., a pressure between 1 to 150 Torr, and flows of DMAH and $H_2$ between 0.02 to 1.00 slm and 1 to 50 slm, respectively.

14. The method of claim 7, further comprising a step of carrying out a cleaning process before the step of forming the aluminum insulating layer in the trench.

15. The method of claim 14, wherein the cleaning process comprises a first cleaning step using a mixture solution having a ratio between 30 to 50:1 in the proportion of H2SO4 to $H_2O_2$ for 5 to 20 minutes at a temperature of between 60 to 100° C. and a second cleaning step using a solution of HF diluted 50 to 500 times for between 20 to 200 seconds.

16. A method of fabricating a semiconductor device using a damascene metal gate including the steps of:
    forming a damascene gate oxide layer and a damascene gate electrode on a semiconductor substrate;
    selectively etching a portion of the damascene gate electrode to a predetermined thickness to form a trench at an upper portion of the damascene gate electrode;

forming an undoped silicon layer in the trench;

turning the undoped silicon layer into an insulating layer;

forming an insulating interlayer on an upper surface of the entire structure; and selectively etching the insulating interlayer to form a contact hole exposing a portion of the semiconductor substrate.

17. The method of claim 16, wherein the undoped silicon layer is grown only at the upper portion of the damascene metal gate in the trench by either a LPCVD method or a UHV-CVD method.

18. The method of claim 17, wherein an initial pressure is set between 7 to 10 Torr by pumping and vacuum cleaning is carried out for 0.5 to 5 minutes before the undoped silicon layer is grown by the UHV-CVD method.

19. The method of claim 17, wherein the undoped silicon layer is formed by the LPCVD method under conditions of DCS (diclorosilane, $SiCl_2H_2$), HCl, and $H_2$ being used for process gas, the respective flows being between 0.1 to 2 slm DCS, 0.1 to 3 slm HCl, $H_2$ 10 to 150 slm, the process temperature being between 750 and 850° C., and the pressure between 10 to 200 Torr.

20. The method of claim 17, wherein the undoped silicon layer is formed by the LPCVD method under conditions of process gas flows being between 0.1 and 2 slm, $SiH_4$/0.2 to 4 slm HCl 10 to 150 slm $H_2$, the process temperature being between 750 and 850° C, and the pressure between 10 to 200 Torr.

21. The method of claim 17, wherein an in-situ cleaning process is further carried out before the undoped silicon layer is grown, wherein the in-situ cleaning process is carried out for 1 to 5 minutes at a temperature of between 850 to 950° C. in an ambient hydrogen atmosphere or wherein the in-situ cleaning process is carried out by RTP (rapid thermal process) in which the temperature is abruptly increased up to 950° C. and then dropped to a silicon growth temperature.

22. The method of claim 16, wherein the step of forming the undoped silicon layer is carried out under the conditions of $SiH_4$ or $Si_2H_6$/Cl being used as process gas, a flow of $SiH_4$ or $Si_2H_6$ between 1 to 20 sccm, a flow of Cl between 0.5 to 5 sccm, a pressure between 1 to 10 Torr, and a temperature between 600 to 800° C.

23. The method of claim 18, wherein between 5 to 50 sccm $H_2$ is added to the step of forming the undoped silicon layer.

24. The method of claim 16, wherein the insulating layer is a silicon oxide layer or a silicon nitride layer.

25. The method of claim 24, wherein the silicon oxide layer is formed by one of oxidation in an ambient oxygen atmosphere, of $N_2O$ plasma treatment oxidation, or of $UV-O_3$ treatment oxidation.

* * * * *